United States Patent
Arslan et al.

(10) Patent No.: US 11,690,212 B2
(45) Date of Patent: Jun. 27, 2023

(54) MEMORY ARCHITECTURE AT BACK-END-OF-LINE

(71) Applicant: Intel Corporation, Santa Clara, CA (US)

(72) Inventors: Umut Arslan, Portland, OR (US); Juan G. Alzate Vinasco, Tigard, OR (US); Fatih Hamzaoglu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 849 days.

(21) Appl. No.: 16/457,610

(22) Filed: Jun. 28, 2019

(65) Prior Publication Data

US 2020/0411524 A1    Dec. 31, 2020

(51) Int. Cl.
| | |
|---|---|
| *H01L 21/768* | (2006.01) |
| *H10B 12/00* | (2023.01) |
| *H01L 27/12* | (2006.01) |
| *G11C 11/407* | (2006.01) |

(52) U.S. Cl.
CPC ......... *H10B 12/315* (2023.02); *H01L 27/124* (2013.01); *H01L 27/1218* (2013.01); *H01L 27/1222* (2013.01); *H01L 27/1225* (2013.01); *H01L 27/1248* (2013.01); *H01L 27/1255* (2013.01); *H10B 12/0335* (2023.02); *G11C 11/407* (2013.01)

(58) Field of Classification Search
CPC ......... H01L 27/10814; H01L 27/10855; H01L 27/1218; H01L 27/1222; H01L 27/1225; H01L 27/124; H01L 27/1248; H01L 27/1255; H01L 27/10873; G11C 11/407
See application file for complete search history.

(56) References Cited

U.S. PATENT DOCUMENTS

| | | | |
|---|---|---|---|
| 2013/0070506 A1* | 3/2013 | Kajigaya | G11C 11/4076 365/51 |
| 2014/0071756 A1* | 3/2014 | Iwai | H01L 27/11582 365/185.11 |
| 2018/0082733 A1* | 3/2018 | Tanaka | G11C 11/4091 |
| 2020/0185023 A1* | 6/2020 | Onuki | G11C 11/405 |
| 2020/0203345 A1* | 6/2020 | Matsuzaki | H01L 27/1225 |

* cited by examiner

*Primary Examiner* — Samuel Park
(74) *Attorney, Agent, or Firm* — Schwabe, Williamson & Wyatt, P.C.

(57) ABSTRACT

Embodiments herein describe techniques for a semiconductor device including a substrate. A first set of memory cells and a first selector are formed within a first group of metal layers and inter-level dielectric (ILD) layers above the substrate. A second set of memory cells and a second selector are formed within a second group of metal layers and ILD layers above the first group of metal layers and ILD layers. The first selector is coupled to the first set of memory cells to select one or more memory cells of the first set of memory cells based on a first control signal. In addition, the second selector is coupled to the second set of memory cells to select one or more memory cells of the second set of memory cells based on a second control signal. Other embodiments may be described and/or claimed.

24 Claims, 7 Drawing Sheets

MEMORY ARCHITECTURE AT BACK-END-OF-LINE

FIELD

Embodiments of the present disclosure generally relate to the field of semiconductor devices, and more particularly, to memory devices at the back-end-of-line of semiconductor processing.

BACKGROUND

A memory device, e.g., a dynamic random access memory (DRAM) array, may include a plurality of memory cells, where a memory cell may include a selector, e.g., a transistor, to control the access to a storage cell, e.g., a capacitor. A silicon transistor in a substrate or a thin-film transistor (TFT) in the back-end-of-line of semiconductor processing may be used as a selector for a memory device. However, current designs and implementations of memory devices, e.g., DRAM memory devices, still face many challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
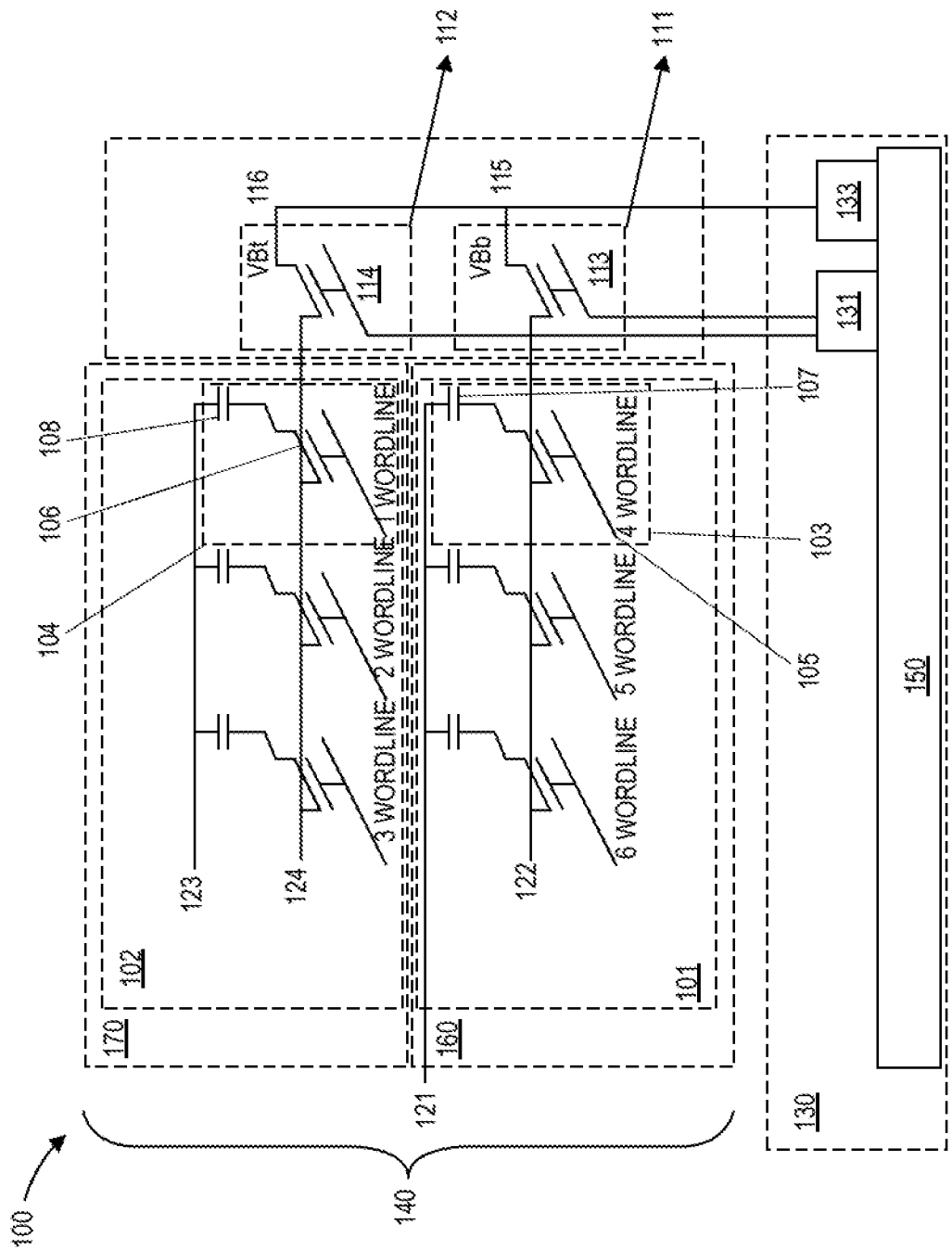
FIGS. 1(a)-1(c) schematically illustrate diagrams of a memory device including memory cells formed within different group of metal layers and inter-level dielectric (ILD) layers and coupled to different selectors, in accordance with some embodiments.

Memory devices are important parts of integrated circuits (IC) and semiconductor devices. High density or high bandwidth memory devices may be particularly useful for many applications, e.g., graphics, artificial intelligence, machine learning, or compute in or near memory. Dynamic random access memory (DRAM), or an enhanced or embedded dynamic random access memory (eDRAM), may be one of the leading candidates for high density or high bandwidth memory devices. A memory array, e.g., a DRAM or an eDRAM, may include a plurality of memory cells, wherein a memory cell may include a selector, e.g., a transistor, to control the access to a storage cell. In embodiments, the storage cell may be a capacitor to store charge, resulting in a 1T1C (one transistor, one capacitor) architecture for the memory cell. In detail, the capacitor can either be charged or discharged; these two states are taken to represent the two values of a bit, conventionally called 0 and 1. Accessing a memory cell may refer to read the state, e.g., charged or discharged, of the capacitor, or to change a state, e.g., store data, of the capacitor. To store data, a voltage is applied to charge or discharge the memory cell storage capacitor to the desired state. Accessing a memory cell may also refer to any other memory operations to be performed on the memory cell.

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin film transistor (TFT) is a kind of field-effect transistor formed at BEOL and including a channel layer, a gate electrode, and source and drain electrodes, over a supporting but non-conducting substrate.

Memory devices may be implemented with capacitor over bit (COB) at BEOL. However, conventional implementations of memory devices may face some problems. For example, the increasing capacity of a memory device may result in increased bitline capacitance at a bitline due to the increased number of memory cells coupled to the same bitline. Accordingly, performance degradation may include reduced read yield, tighter interconnect pitch with higher processing cost, or reduced memory array efficiency. One solution may use a CMOS bitline multiplexer circuit implemented on the FEOL process, while another solution may use short bitline architecture. CMOS multiplexer based solution may require interconnect pitch that is 0.6× tighter than that of single-stack DRAM, which may lead to increased process cost and efforts. Short bitline architecture may not be scalable beyond two memory layers, and may have area overhead resulting in a larger die area with substantially reduced memory density.

Embodiments herein present a memory device that have multiple memory cells of a same bitline divided into smaller sets, where each set of memory cells are coupled to a selector to control the access to the set of memory cells. For example, only one set of memory cells are accessed at a time, which are only a portion of the memory cells of the same bitline. In such a way, the capacitance of the accessed memory cells are smaller than the capacitance of all the memory cells of the bitline, leading to improved access speed, improved read yield, and other benefits. A set of memory cells and its corresponding selector are formed within a group of metal layers and ILD layers. Output of the selectors are coupled together and coupled to CMOS circuits at the FEOL. In addition, the selectors may also have their control signals coupled to control logic circuits located in the FEOL. Hence, embodiments herein may have limited additional process cost since the selectors may be TFTs as the TFTs used in a DRAM memory array. The embodiments also eliminate the need for tight pitch interconnect layers under the DRAM memory array that would otherwise be required to implement a CMOS multiplexer. Embodiments herein may offer a solution to scale TFT DRAM memory arrays beyond 2 stacks with limited area overhead.

Embodiments herein present a semiconductor device including a substrate. A first set of memory cells are formed within a first group of metal layers and ILD layers above the substrate. A second set of memory cells are formed within a second group of metal layers and ILD layers above the first group of metal layers and ILD layers. A first selector is formed within the first group of metal layers and ILD layers and coupled to the first set of memory cells to select one or more memory cells of the first set of memory cells based on a first control signal. In addition, a second selector is formed within the second group of metal layers and ILD layers and coupled to the second set of memory cells to select one or more memory cells of the second set of memory cells based on a second control signal.

Embodiments herein present a method for forming a memory device. The method including forming a first set of memory cells and a first selector within a first group of metal layers and ILD layers above a substrate, where the first selector is coupled to the first set of memory cells to select one or more memory cells of the first set of memory cells based on a first control signal. The method also include forming a second set of memory cells and a second selector within a second group of metal layers and ILD layers above the first group of metal layers and ILD layers, where the second selector is coupled to the second set of memory cells to select one or more memory cells of the second set of memory cells based on a second control signal.

Embodiments herein present a computing device, which includes a circuit board, and a memory device coupled to the circuit board. In more detail, the memory device includes a first set of memory cells formed within a first group of metal layers and ILD layers above the substrate. The memory device further includes a second set of memory cells formed within a second group of metal layers and ILD layers above the first group of metal layers and ILD layers. A first selector is formed within the first group of metal layers and ILD layers and coupled to the first set of memory cells to select one or more memory cells of the first set of memory cells based on a first control signal. In addition, a second selector is formed within the second group of metal layers and ILD layers and coupled to the second set of memory cells to select one or more memory cells of the second set of memory cells based on a second control signal.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
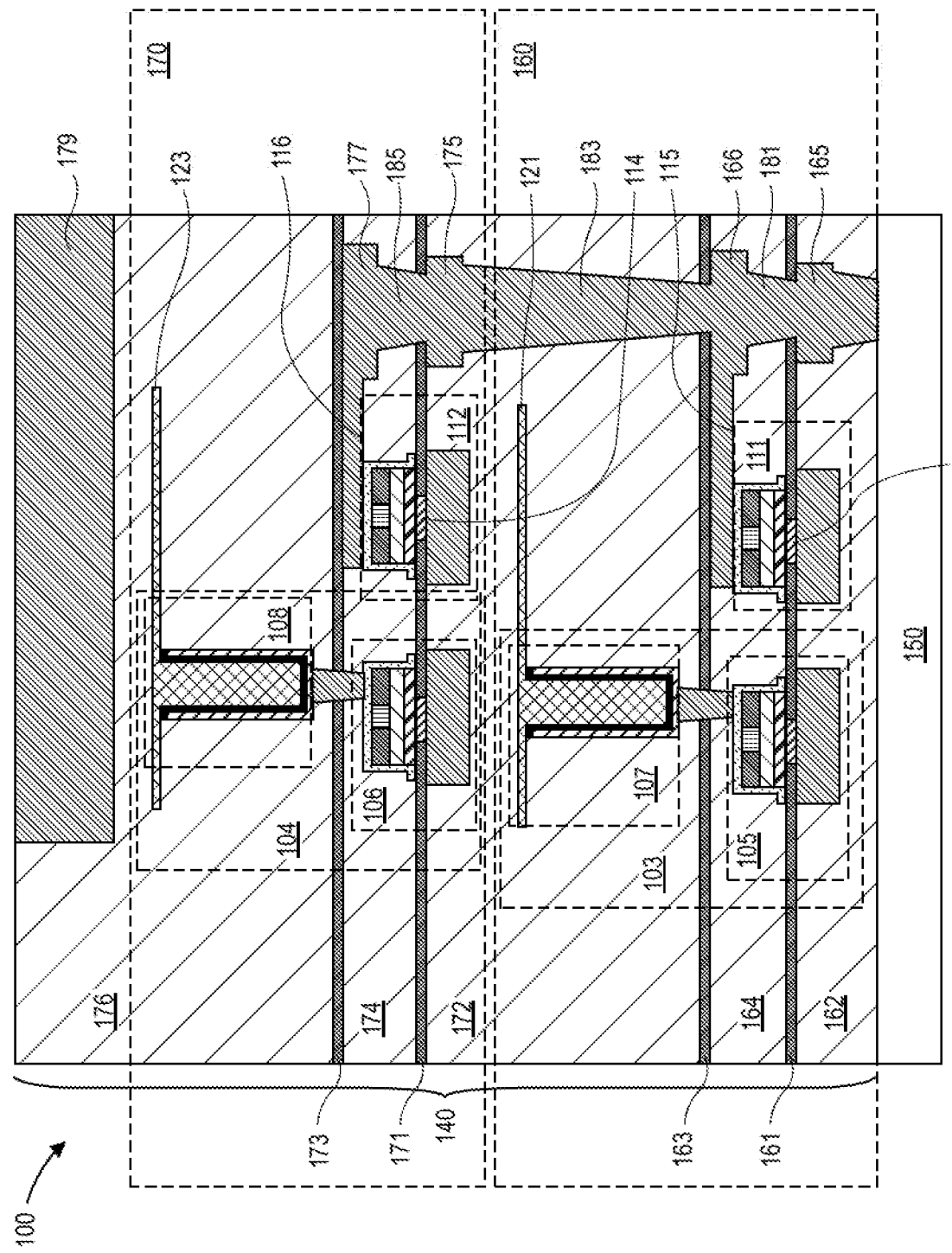
Figure 1C:
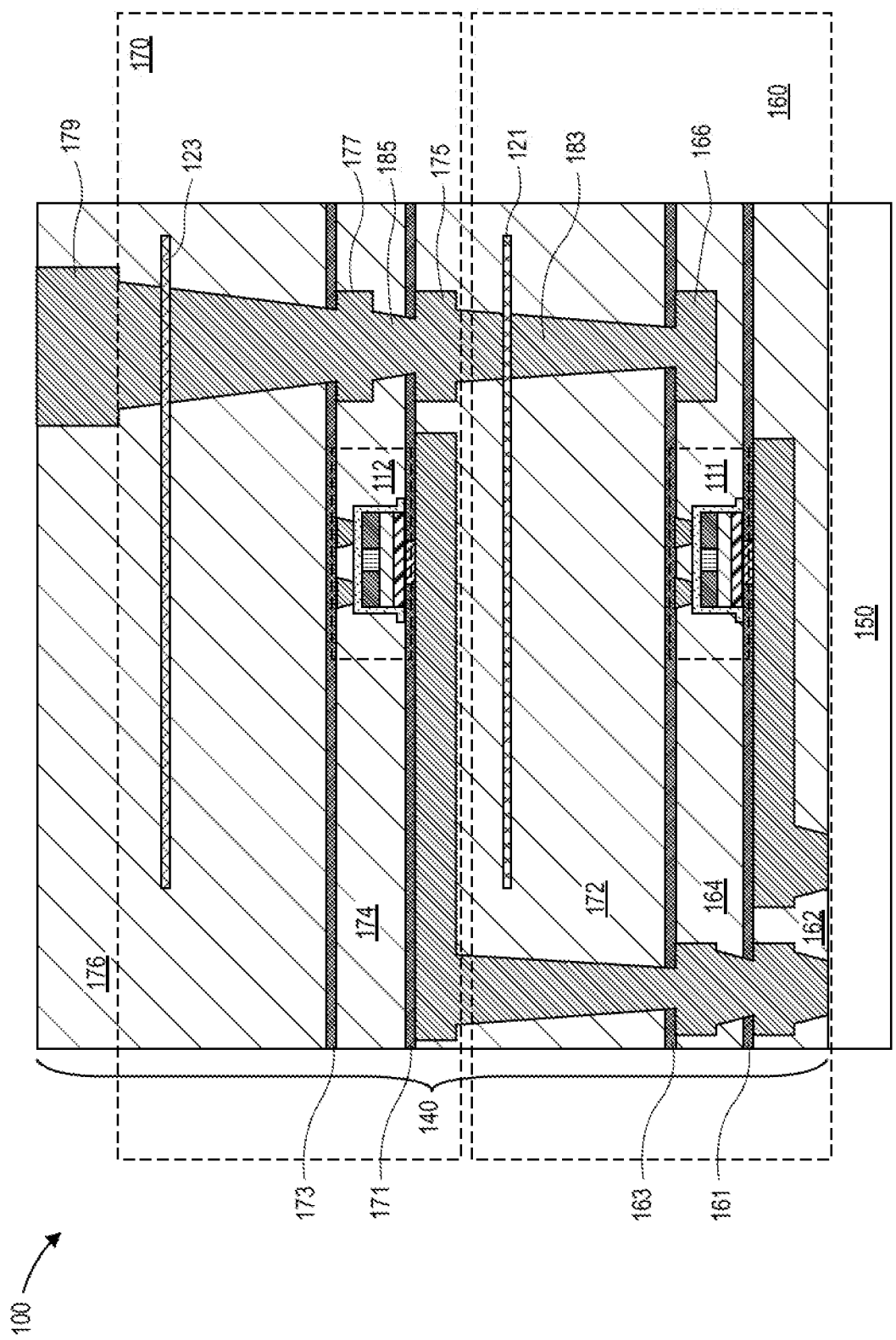

FIGS. 1(a)-1(c) schematically illustrate diagrams of a memory device 100 including memory cells formed within different group of metal layers and ILD layers and coupled to different selectors, e.g., a selector 111, a selector 112, in accordance with some embodiments. FIG. 1(a) shows the semiconductor device 100 in a schematic view. FIG. 1(b) shows the semiconductor device 100 in a cross-sectional view at the bitline direction. FIG. 1(c) shows the semiconductor device 100 in a cross-sectional view at the word line direction. A component labeled by a same reference in any of the FIGS. 1(a)-1(c) refers to a same component. For example, the selector 111 shown in FIGS. 1(a)-1(c) refers to a same selector. Similarly, the selector 112 shown in FIGS. 1(a)-1(c) refers to a same selector.

In embodiments, the semiconductor device 100 includes a substrate 150. The semiconductor device 100 further includes various ILD layers, e.g., an ILD layer 162, an ILD layer 164, an ILD layer 172, an ILD layer 174, and an ILD layer 176; and various metal layers, e.g., a metal layer 165, a metal layer 166, a metal layer 175, a metal layer 177, and a metal layer 179. Metal layers and ILD layers may be separated by various other layers, e.g., an etch stop layer 161, an etch stop layer 163, an etch stop layer 171, and an etch stop layer 173. A group 160 of metal layers and ILD layers includes the ILD layer 162, the ILD layer 164, and a portion of the ILD layer 172, the metal layer 165, the metal layer 166, and other layers between the listed ILD layers and metal layers, e.g., the etch stop layer 161. A group 170 of metal layers and ILD layers includes a portion of the ILD layer 172, the ILD layer 174, and the ILD layer 176, the metal layer 175, the metal layer 177, and other layers between the listed ILD layers and metal layers, e.g., the etch stop layer 171. Both the group 160 and the group 170 of metal layers and ILD layers are formed at BEOL 140 that includes an interconnect structure above the substrate 150. The layers shown in FIGS. 1(a)-1(c) are only for examples, and there may be many other layers not shown, e.g., a passivation layer, or a liner. The number of layers shown in FIGS. 1(a)-1(c) are for examples, and are not limiting.

In embodiments, the semiconductor device 100 includes a first set of memory cells 101 formed within the group 160 of metal layers and ILD layers above the substrate 150, and a second set of memory cells 102 formed within the group 170 of metal layers and ILD layers above the group 160 of metal layers and ILD layers. In some embodiments, the first set of memory cells 101 and the second set of memory cells 102 may have a same number of memory cells, e.g., 3, as shown in FIG. 1(a). In addition, one memory cell of the first set of memory cells 101 is above and vertically aligned with another memory cell of the second set of memory cells 102. For example, the first set of memory cells 101 includes a memory cell 103, and the second set of memory cells 102 includes a memory cell 104, where the memory cell 104 is above and vertically aligned with the memory cell 103, as shown in FIG. 1(a).

In detail, the memory cell 103 includes a first TFT 105 and a first capacitor 107, and the memory cell 104 includes a second TFT 106 and a second capacitor 108. A gate electrode of the first TFT 105 is coupled to a word line of the memory cell 103, and a source electrode of the first TFT 105 is coupled to a bitline 122 of the memory cell 103. A drain electrode of the first TFT 105 is coupled to a bottom plate of the first capacitor 107. Furthermore, a top plate of the first capacitor 107 is coupled to a source line 121, which may be called as capacitor top plate (CTP). Similarly, a gate electrode of the second TFT 106 is coupled to a word line of the memory cell 104, and a source electrode of the second TFT 106 is coupled to a bitline 124 of the memory cell 104. A drain electrode of the second TFT 106 is coupled to a bottom plate of the second capacitor 108. Furthermore, a top plate of the second capacitor 108 is coupled to a source line 123.

In embodiments, the selector 111 is coupled to the first set of memory cells 101 to select one or more memory cells of the first set of memory cells 101 based on a control signal 113, while the selector 112 is coupled to the second set of memory cells 102 to select one or more memory cells of the second set of memory cells 102 based on a control signal 114. The control signal 113 of the selector 111 and the control signal 114 of the selector 112 may be coupled to control logic circuits 131 below the group 160 of metal layers and ILD layers, as shown in FIG. 1(a). In some embodiments, the control logic circuits 131 are located in the FEOL 130 for the semiconductor device 100.

The first set of memory cells 101 and the second set of memory cells 102 may be coupled to a same bitline through the selector 111 and the selector 112. For example, an output 115 of the selector 111 and an output 116 of the selector 112 may be coupled together and electrically shorted through one or more vias, e.g., via 181, via 183, via 185 and further coupled to a CMOS circuit 133 at the FEOL 130, as shown in FIGS. 1(a)-1(b).

In embodiments, the selector 111 and the selector 112 may be implemented as a TFT. When the first set of memory cells 101 are accessed, the TFT for the selector 111 is ON, the TFT for the selector 112 is OFF. Hence, only one set of memory cells are accessed at a time, which are only a portion of the memory cells of the same bitline. In such a way, the capacitance of the accessed memory cells are smaller than the capacitance of all the memory cells of the bitline, leading to improved access speed, improved read yield, and other benefits.

The selector 111 is formed within the group 160 of metal layers and ILD layers. The selector 112 is formed within the group 170 of metal layers and ILD layers. The selector 112 is above the selector 111 and vertically aligned with the selector 111. In embodiments, all memory cells, e.g., the memory cell 103, of the first set of memory cells 101 are located in a same side, e.g., the left side, of the selector 111, while all memory cells, e.g., the memory cell 104, of the second set of memory cells 102 are located in a same side of the selector 112. In embodiments, when the selector 111 and the selector 112 are implemented as a TFT, they can be made at the same time as the TFTs used in the memory cells for the first set of memory cells 101 and the second set of memory cells 102. Hence, embodiments herein may have limited additional process cost while having reduced capacitance of the accessed memory cells.

In embodiments, the semiconductor device 100 may further include one or more additional sets of memory cells, and one or more additional selectors, formed in one or more metal layers and ILD layers above the second group of metal layers and ILD layers.

In embodiments, the substrate 150 may include a material selected from the group consisting of a silicon substrate, a glass substrate, a metal substrate, and a plastic substrate. The ILD layers, e.g., the ILD layer 162, the ILD layer 164, the ILD layer 172, the ILD layer 174, and the ILD layer 176 may include a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass. The metal layer 165, the metal layer 166, the metal layer 175, the metal layer 177, and the metal layer 179, may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

In embodiments, various TFTs, e.g., the TFT 105 of the memory cell 103, the TFT 106 of the memory cell 104, the TFT for the selector 111, and the TFT for the selector 112, have a channel layer including a channel material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Figure 2:
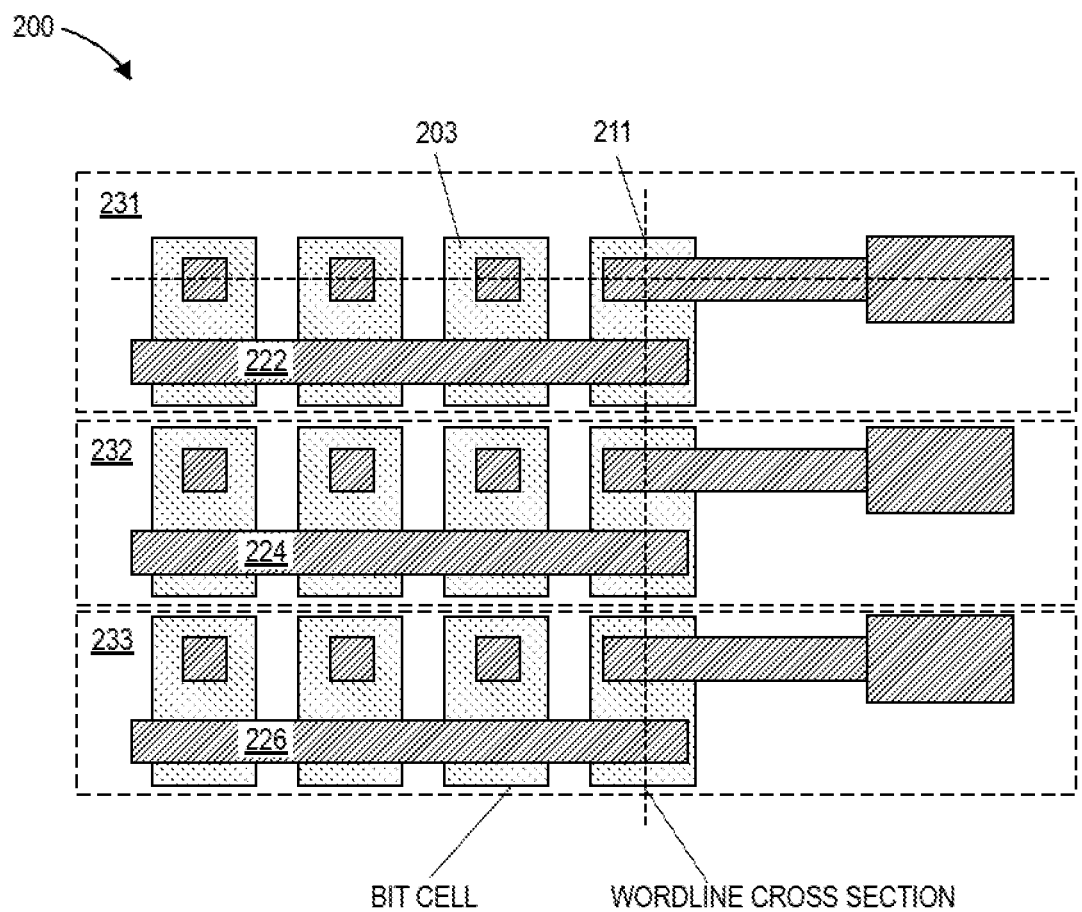
FIG. 2 schematically illustrates a diagram of a memory device in top down view including memory cells within different group of metal layers and ILD layers and coupled to different selectors, in accordance with some embodiments.

FIG. 2 schematically illustrates a diagram of a memory device 200 in top down view including memory cells within different group of metal layers and ILD layers and coupled to different selectors, in accordance with some embodiments. The memory device 200 includes groups of memory cells in different bitlines, e.g., a group of memory cells 231 for a bitline 222, a group of memory cells 232 for a bitline 224, and a group of memory cells 233 for a bitline 226. In embodiments, the group of memory cells 231, the group of memory cells 232, or the group of memory cells 233, may be similar to the memory cells in the semiconductor device 100 as shown in FIGS. 1(*a*)-1(*c*). For example, the group of memory cells 231 for a bitline 222 includes multiple memory cells divided into multiple subsets. A first set of memory cells of the group of memory cells 231 are formed within a first group of metal layers and ILD layers, while a second set of memory cells of the group of memory cells 231 are formed within a second group of metal layers and ILD layers below the first group of metal layers and ILD layers. A first selector, e.g., a selector 211, is formed within the first group of metal layers and ILD layers and coupled to the first set of memory cells to select one or more memory cells of the first set of memory cells based on a first control signal, and a second selector, e.g., a selector 211, is formed within the second group of metal layers and ILD layers and coupled to the second set of memory cells to select one or more memory cells of the second set of memory cells based on a second control signal.

Figure 3:
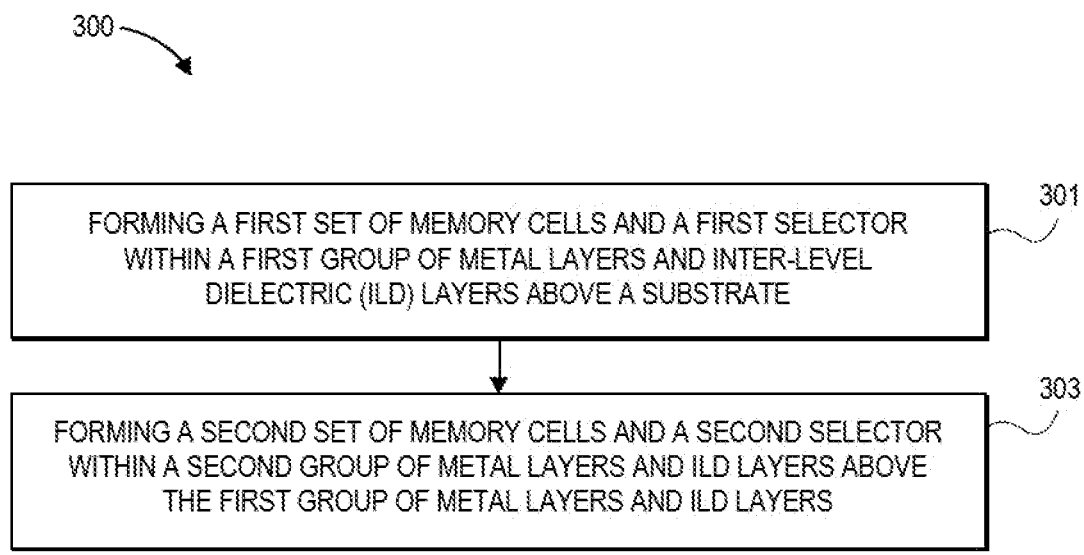
FIG. 3 illustrates a process for forming a memory device including memory cells within different group of metal layers and ILD layers and coupled to different selectors, in accordance with some embodiments.

FIG. 3 illustrates a process for forming a memory device including memory cells within different group of metal layers and ILD layers and coupled to different selectors, in accordance with some embodiments. In embodiments, the process 300 may be applied to form the semiconductor device 100 including memory cells within different group of metal layers and ILD layers and coupled to different selectors, as shown in FIGS. 1(*a*)-1(*c*).

At block 301, the process 300 may include forming a first set of memory cells and a first selector within a first group of metal layers and ILD layers above a substrate. For example, the process 300 may include forming the first set of memory cells 101 and the selector 111 within the group 160 of metal layers and ILD layers above the substrate 150, as shown in FIGS. 1(*a*)-1(*c*). The selector 111 is coupled to the first set of memory cells 101 to select one or more memory cells of the first set of memory cells 101 based on the control signal 113. There may be many steps of detailed operations to be performed for the block 301. For example, a memory cell of the first set of memory cells 101 includes a TFT, and the selector 111 includes a TFT. Operations may be performed to form the multiple TFTs for the memory cells in the first set of memory cells 101 and the selector 111. Afterwards, operations may be performed to form capacitors for the memory cells of the first set of memory cells 101.

At block 303, the process 300 may include forming a second set of memory cells and a second selector within a second group of metal layers and ILD layers above the first group of metal layers and ILD layers. For example, the process 300 may include forming the second set of memory cells 102 and the selector 112 within the group 170 of metal layers and ILD layers above the group 160 of metal layers and ILD layers, as shown in FIGS. 1(*a*)-1(*c*). The selector 112 is coupled to the second set of memory cells 102 to select one or more memory cells of the second set of memory cells 101 based on the control signal 114. Similar operations may be performed for the block 303 as those operations performed for the block 301.

In addition, the process 300 may include additional operations to form other layers, e.g., ILD layers, encapsulation layers, insulation layers, not shown.

Figure 4:
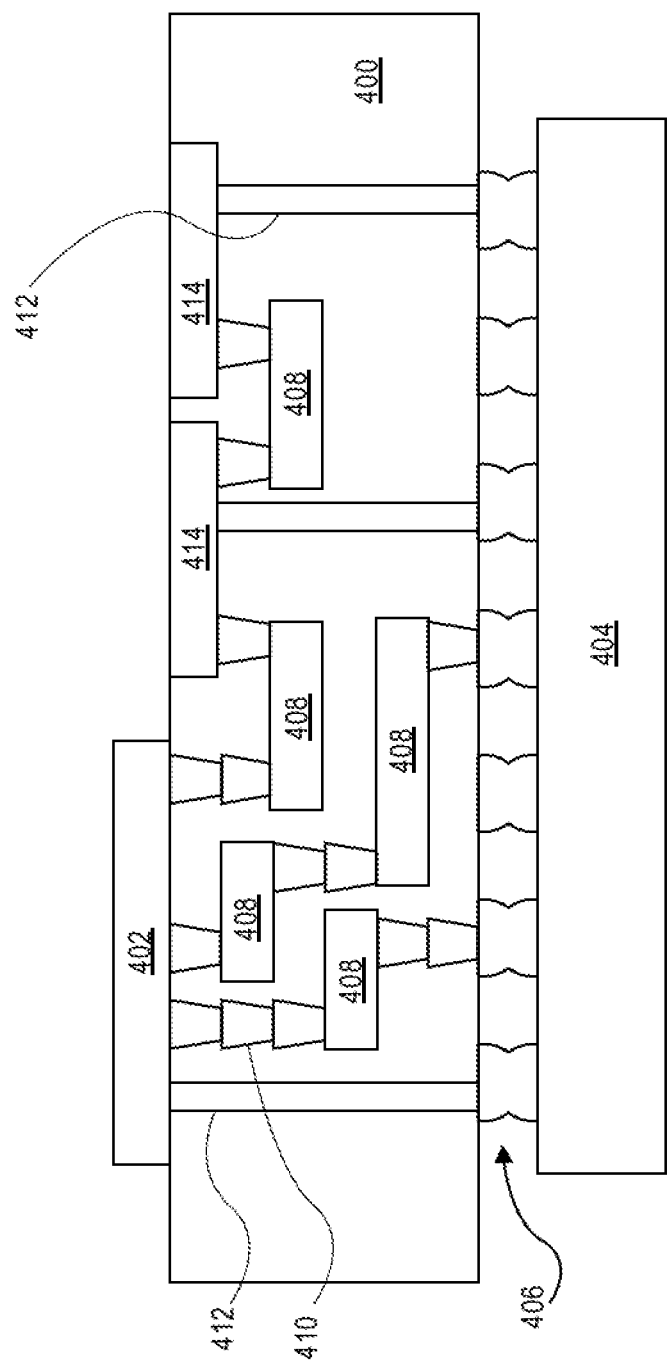
FIG. 4 schematically illustrates an interposer implementing one or more embodiments of the disclosure, in accordance with some embodiments.

FIG. 4 illustrates an interposer 400 that includes one or more embodiments of the disclosure. The interposer 400 is an intervening substrate used to bridge a first substrate 402 to a second substrate 404. The first substrate 402 may be, for instance, a substrate support for multiple memory cells, e.g., the first set of memory cells 101 and the second set of memory cells 102 as shown in FIGS. 1(*a*)-1(*c*), the group of memory cells 231, the group of memory cells 232, and the group of memory cells 233, as shown in FIG. 2. The second substrate 404 may be, for instance, a memory module, a computer motherboard, or another integrated circuit die. For example, the second substrate 404 may be a memory module including the memory array 400 as shown in FIG. 4. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer 400 may be formed of alternate rigid or flexible materials that may include the same materials described above for use in a semiconductor substrate, such as silicon, germanium, and other group III-V and group IV materials.

The interposer 400 may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the disclosure, apparatuses or processes disclosed herein may be used in the fabrication of interposer 400.

Figure 5:
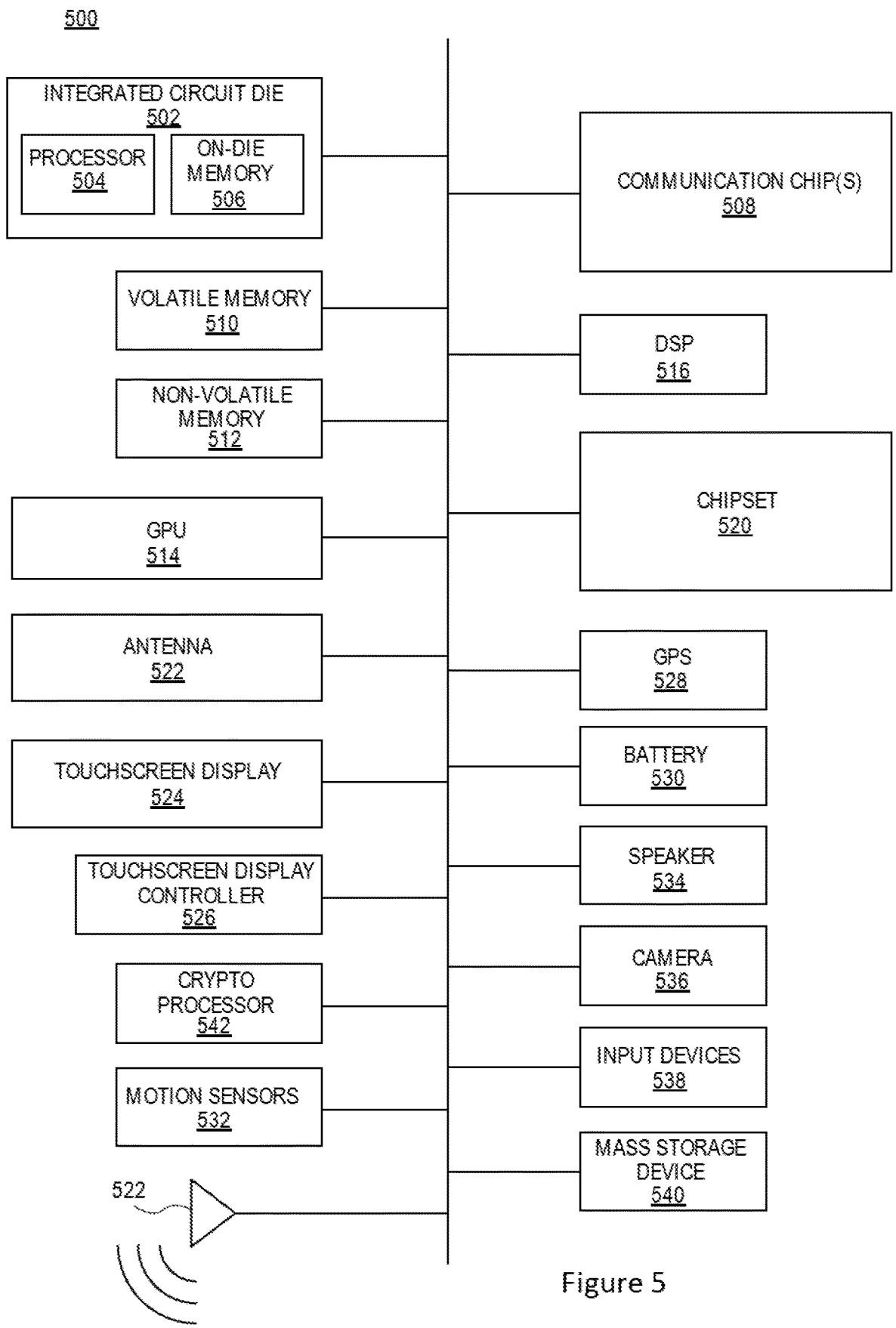
FIG. 5 schematically illustrates a computing device built in accordance with an embodiment of the disclosure, in accordance with some embodiments.

FIG. 5 illustrates a computing device 500 in accordance with one embodiment of the disclosure. The computing device 500 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a processor 504 as well as on-die memory 506, often used as cache memory, which can be provided by technologies such as embedded DRAM (eDRAM), or SRAM. For example, the on-die memory 506 may include multiple memory cells, e.g., the first set of memory cells 101 and the second set of memory cells 102 as shown in FIGS. 1(*a*)-1(*c*), the group of memory cells 231, the group of memory cells 232, and the group of memory cells 233, as shown in FIG. 2.

In embodiments, the computing device 500 may include a display or a touchscreen display 524, and a touchscreen display controller 526. A display or the touchscreen display 524 may include a FPD, an AMOLED display, a TFT LCD, a micro light-emitting diode (μLED) display, or others.

Computing device 500 may include other components that may or may not be physically and electrically coupled to the motherboard or fabricated within a SoC die. These other components include, but are not limited to, volatile memory 510 (e.g., dynamic random access memory (DRAM), non-volatile memory 512 (e.g., ROM or flash memory), a graphics processing unit 514 (GPU), a digital signal processor (DSP) 516, a crypto processor 542 (e.g., a specialized processor that executes cryptographic algorithms within hardware), a chipset 520, at least one antenna 522 (in some implementations two or more antenna may be used), a battery 530 or other power source, a power amplifier (not shown), a voltage regulator (not shown), a global positioning system (GPS) device 528, a compass, a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 of the computing device 500 includes one or more devices, such as transistors. The term "processor" may refer to any device or portion of a device that processes electronic data from registers and/or memory to transform that electronic data into other electronic data that may be stored in registers and/or memory. The communications logic unit 508 may also include one or more devices, such as transistors.

In further embodiments, another component housed within the computing device 500 may contain one or more devices, such as DRAM, that are formed in accordance with implementations of the current disclosure, e.g., multiple memory cells, e.g., the first set of memory cells 101 and the second set of memory cells 102 as shown in FIGS. 1(*a*)-1(*c*), the group of memory cells 231, the group of memory cells 232, and the group of memory cells 233, as shown in FIG. 2; or a semiconductor device formed following the process 300.

In various embodiments, the computing device 500 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some non-limiting Examples are provided below.

Example 1 may include a semiconductor device, comprising: a substrate; a first set of memory cells formed within a first group of metal layers and inter-level dielectric (ILD) layers above the substrate; a first selector formed within the first group of metal layers and ILD layers and coupled to the first set of memory cells to select one or more memory cells of the first set of memory cells based on a first control signal; a second set of memory cells formed within a second group of metal layers and ILD layers above the first group of metal layers and ILD layers; and a second selector within the second group of metal layers and ILD layers and coupled to the second set of memory cells to select one or more memory cells of the second set of memory cells based on a second control signal.

Example 2 may include the semiconductor device of example 1 and/or some other examples herein, further comprising one or more additional sets of memory cells, and one or more additional selectors, formed in one or more metal layers and ILD layers above the second group of metal layers and ILD layers.

Example 3 may include the semiconductor device of example 1 and/or some other examples herein, wherein the second selector is above the first selector and vertically aligned with the first selector; and a second memory cell of the second set of memory cells is above a first memory cell of the first set of memory cells and vertically aligned with the first memory cell.

Example 4 may include the semiconductor device of examples 1-3 and/or some other examples herein, wherein all memory cells of the first set of memory cells are located in a same side of the first selector; and all memory cells of the second set of memory cells are located in the same side of the second selector.

Example 5 may include the semiconductor device of examples 1-3 and/or some other examples herein, wherein the second selector and the first selector are a TFT; when the TFT for the first selector is ON, the TFT for the second selector is OFF, when the first group of memory cells are accessed.

Example 6 may include the semiconductor device of examples 1-3 and/or some other examples herein, wherein the first control signal of the first selector and the second control signal of the second selector are coupled to control logic circuits below the first group of metal layers and ILD layers.

Example 7 may include the semiconductor device of example 6 and/or some other examples herein, wherein the control logic circuits are located in the front end of line for the semiconductor device.

Example 8 may include the semiconductor device of examples 1-3 and/or some other examples herein, wherein an output of the first selector and an output of the second selector are coupled together and electrically shorted through one or more vias.

Example 9 may include the semiconductor device of example 8 and/or some other examples herein, wherein the output of the first selector and the output of the second selector is coupled to a CMOS circuit at the FEOL.

Example 10 may include the semiconductor device of examples 1-3 and/or some other examples herein, wherein the first set of memory cells and the second set of memory cells are coupled to a same bitline through the first selector and the second selector.

Example 11 may include the semiconductor device of examples 1-3 and/or some other examples herein, wherein the first set of memory cells and the second set of memory cells have a same number of memory cells, one memory cell of the first set of memory cells is above and vertically aligned with another memory cell of the second set of memory cells.

Example 12 may include the semiconductor device of examples 1-3 and/or some other examples herein, wherein a first memory cell of the first set of memory cells includes a first TFT and a first capacitor, and a second memory cell of the second set of memory cells includes a second TFT and a second capacitor.

Example 13 may include the semiconductor device of example 12 and/or some other examples herein, wherein a gate electrode of the first TFT is coupled to a word line of the first memory cell, and a source electrode of the first TFT is coupled to a bitline of the first memory cell.

Example 14 may include the semiconductor device of example 12 and/or some other examples herein, wherein the first group of metal layers and ILD layers and the second group of metal layers and ILD layers are within an interconnect structure that is above the substrate.

Example 15 may include the semiconductor device of examples 1-3 and/or some other examples herein, wherein the substrate includes a material selected from the group consisting of a silicon substrate, a glass substrate, a metal substrate, and a plastic substrate.

Example 16 may include the semiconductor device of examples 1-3 and/or some other examples herein, wherein the first group of ILD layers or the second group of ILD layers include a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 17 may include the semiconductor device of examples 1-3 and/or some other examples herein, wherein the first group of metal layers or the second group of metal layers include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 18 may include the semiconductor device of examples 1-3 and/or some other examples herein, wherein a first memory cell of the first set of memory cells includes a first TFT, and a second memory cell of the second set of memory cells includes a second TFT, and the first TFT or the second TFT has a channel including a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 19 may include a method for forming a memory device, the method comprising: forming a first set of memory cells and a first selector within a first group of metal layers and inter-level dielectric (ILD) layers above a substrate, wherein the first selector is coupled to the first set of memory cells to select one or more memory cells of the first set of memory cells based on a first control signal; forming a second set of memory cells and a second selector within a second group of metal layers and ILD layers above the first group of metal layers and ILD layers, wherein the second selector is coupled to the second set of memory cells to select one or more memory cells of the second set of memory cells based on a second control signal.

Example 20 may include the method of example 19 and/or some other examples herein, wherein the second selector and the first selector are a TFT; the TFT for the first selector is ON and the TFT for the second selector is OFF when the first group of memory cells are accessed.

Example 21 may include the method of examples 19-20 and/or some other examples herein, further comprising: forming metal electrodes and vias to couple together and electrically shorted an output of the first selector and an output of the second selector.

Example 22 may include a computing device, comprising: a circuit board; and a memory device coupled to the circuit board, wherein the memory device includes: a first set of memory cells formed within a first group of metal layers and inter-level dielectric (ILD) layers above the substrate; a first selector formed within the first group of metal layers and ILD layers and coupled to the first set of memory cells to select one or more memory cells of the first set of memory cells based on a first control signal; a second set of memory cells formed within a second group of metal layers and ILD layers above the first group of metal layers and ILD layers; and a second selector within the second group of metal layers and ILD layers and coupled to the second set of memory cells to select one or more memory cells of the second set of memory cells based on a second control signal.

Example 23 may include the computing device of example 22 and/or some other examples herein, wherein a first memory cell of the first set of memory cells includes a first TFT and a first capacitor, and a second memory cell of the second set of memory cells includes a second TFT and a second capacitor.

Example 24 may include the computing device of examples 22-23 and/or some other examples herein, wherein the second selector is above the first selector and vertically aligned with the first selector; and a second memory cell of the second set of memory cells is above a first memory cell of the first set of memory cells and vertically aligned with the first memory cell.

Example 25 may include the computing device of examples 22-23 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a first set of memory cells formed within a first group of metal layers and inter-level dielectric (ILD) layers above the substrate;
   a first selector formed within the first group of metal layers and ILD layers and coupled to the first set of memory cells to select one or more memory cells of the first set of memory cells based on a first control signal;
   a second set of memory cells formed within a second group of metal layers and ILD layers above the first group of metal layers and ILD layers; and
   a second selector within the second group of metal layers and ILD layers and coupled to the second set of memory cells to select one or more memory cells of the second set of memory cells based on a second control signal, wherein the first set of memory cells and the second set of memory cells are coupled to a same bitline through the first selector and the second selector.

2. The semiconductor device of claim 1, further comprising one or more additional sets of memory cells, and one or more additional selectors, formed in one or more metal layers and ILD layers above the second group of metal layers and ILD layers.

3. The semiconductor device of claim 1, wherein the second selector is above the first selector and vertically aligned with the first selector; and a second memory cell of the second set of memory cells is above a first memory cell of the first set of memory cells and vertically aligned with the first memory cell.

4. The semiconductor device of claim 1, wherein all memory cells of the first set of memory cells are located in a same side of the first selector; and
   all memory cells of the second set of memory cells are located in the same side of the second selector.

5. The semiconductor device of claim 1, wherein the second selector and the first selector are a TFT; when the TFT for the first selector is ON, the TFT for the second selector is OFF, when the first group of memory cells are accessed.

6. The semiconductor device of claim 1, wherein the first control signal of the first selector and the second control signal of the second selector are coupled to control logic circuits below the first group of metal layers and ILD layers.

7. The semiconductor device of claim 6, wherein the control logic circuits are located in a front end of line for the semiconductor device.

8. The semiconductor device of claim 1, wherein an output of the first selector and an output of the second selector are coupled together and electrically shorted through one or more vias.

9. The semiconductor device of claim 8, wherein the output of the first selector and the output of the second selector is coupled to a CMOS circuit at a front end of line.

10. The semiconductor device of claim 1, wherein the first set of memory cells and the second set of memory cells have a same number of memory cells, one memory cell of the first set of memory cells is above and vertically aligned with another memory cell of the second set of memory cells.

11. The semiconductor device of claim 1, wherein a first memory cell of the first set of memory cells includes a first TFT and a first capacitor, and a second memory cell of the second set of memory cells includes a second TFT and a second capacitor.

12. The semiconductor device of claim 11, wherein a gate electrode of the first TFT is coupled to a word line of the first memory cell, and a source electrode of the first TFT is coupled to a bitline of the first memory cell.

13. The semiconductor device of claim 11, wherein the first group of metal layers and ILD layers and the second group of metal layers and ILD layers are within an interconnect structure that is above the substrate.

14. The semiconductor device of claim 1, wherein the substrate includes a material selected from the group consisting of a silicon substrate, a glass substrate, a metal substrate, and a plastic substrate.

15. The semiconductor device of claim 1, wherein the first group of ILD layers or the second group of ILD layers include a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

16. The semiconductor device of claim 1, wherein the first group of metal layers or the second group of metal layers include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

17. The semiconductor device of claim 1, wherein a first memory cell of the first set of memory cells includes a first TFT, and a second memory cell of the second set of memory cells includes a second TFT, and the first TFT or the second TFT has a channel including a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

18. A method for forming a memory device, the method comprising:
forming a first set of memory cells and a first selector within a first group of metal layers and inter-level dielectric (ILD) layers above a substrate, wherein the first selector is coupled to the first set of memory cells to select one or more memory cells of the first set of memory cells based on a first control signal;
forming a second set of memory cells and a second selector within a second group of metal layers and ILD layers above the first group of metal layers and ILD layers, wherein the second selector is coupled to the second set of memory cells to select one or more memory cells of the second set of memory cells based on a second control signal, wherein the first set of memory cells and the second set of memory cells are coupled to a same bitline through the first selector and the second selector.

19. The method of claim 18, wherein the second selector and the first selector are a TFT; the TFT for the first selector is ON and the TFT for the second selector is OFF when the first group of memory cells are accessed.

20. The method of claim 18, further comprising:
forming metal electrodes and vias to couple together and electrically shorting an output of the first selector and an output of the second selector.

21. A computing device, comprising:
a circuit board; and
a memory device coupled to the circuit board, wherein the memory device includes:
a first set of memory cells formed within a first group of metal layers and inter-level dielectric (ILD) layers above the substrate;
a first selector formed within the first group of metal layers and ILD layers and coupled to the first set of memory cells to select one or more memory cells of the first set of memory cells based on a first control signal;
a second set of memory cells formed within a second group of metal layers and ILD layers above the first group of metal layers and ILD layers; and
a second selector within the second group of metal layers and ILD layers and coupled to the second set of memory cells to select one or more memory cells of the second set of memory cells based on a second control signal, wherein the first set of memory cells and the second set of memory cells are coupled to a same bitline through the first selector and the second selector.

22. The computing device of claim 21, wherein a first memory cell of the first set of memory cells includes a first TFT and a first capacitor, and a second memory cell of the second set of memory cells includes a second TFT and a second capacitor.

23. The computing device of claim 21, wherein the second selector is above the first selector and vertically aligned with the first selector; and a second memory cell of the second set of memory cells is above a first memory cell of the first set of memory cells and vertically aligned with the first memory cell.

24. The computing device of claim 21, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *